US008745564B2

(12) United States Patent
Nomura (10) Patent No.: US 8,745,564 B2
(45) Date of Patent: Jun. 3, 2014

(54) DATA PROCESSING APPARATUS AND METHOD FOR CONTROLLING THE APPARATUS

(75) Inventor: Yoshihisa Nomura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 638 days.

(21) Appl. No.: 13/003,272

(22) PCT Filed: Mar. 2, 2010

(86) PCT No.: PCT/JP2010/053719
§ 371 (c)(1),
(2), (4) Date: Jan. 7, 2011

(87) PCT Pub. No.: WO2010/119736
PCT Pub. Date: Oct. 21, 2010

(65) Prior Publication Data
US 2011/0109931 A1    May 12, 2011

(30) Foreign Application Priority Data
Apr. 13, 2009 (JP) .................................. 2009-097391

(51) Int. Cl.
*G06F 17/50* (2006.01)
(52) U.S. Cl.
USPC ........................................................ 716/117
(58) Field of Classification Search
USPC ........................................................ 716/117
See application file for complete search history.

(56) References Cited

U.S. PATENT DOCUMENTS

| | | | | |
|---|---|---|---|---|
| 7,328,335 B1 * | 2/2008 | Sundararajan et al. | ........... | 713/1 |
| 7,689,726 B1 * | 3/2010 | Sundararajan et al. | ........... | 710/8 |
| 8,471,593 B2 * | 6/2013 | Vorbach et al. | .................. | 326/41 |
| 2002/0105833 A1 * | 8/2002 | Aoyama et al. | ........... | 365/185.24 |
| 2002/0156998 A1 * | 10/2002 | Casselman | .................... | 712/227 |
| 2004/0117519 A1 * | 6/2004 | Smith | ............................. | 710/22 |
| 2008/0024163 A1 | 1/2008 | Marui | | |

FOREIGN PATENT DOCUMENTS

| | | |
|---|---|---|
| JP | 8-250685 | 9/1996 |
| JP | H11-17524 A | 1/1999 |
| JP | H11-225063 A | 8/1999 |
| JP | 11-274915 | 10/1999 |
| JP | 2004-23417 | 1/2004 |
| JP | 2004048228 A | 2/2004 |
| JP | 2006-260654 | 9/2006 |

(Continued)

OTHER PUBLICATIONS

Japanese Office Action dated May 13, 2013, in counterpart Japanese Application No. 2009-097391.

(Continued)

*Primary Examiner* — Suresh Memula
(74) *Attorney, Agent, or Firm* — Fitzpatrick, Cella, Harper & Scinto (57) ABSTRACT

The present invention provides a data processing apparatus having a programmable logic and a method for controlling the apparatus. If it is determined that the reconfiguration of the programmable logic is necessary, register setting data for reconfiguring the programmable logic is supplied to the programmable logic. The programmable logic reads out circuit information from a memory storing the circuit information in accordance with the register setting data and reconfigures a function of the programmable logic. A CPU transfers the register setting data to the programmable logic and then transfers data to be processed by the programmable logic whose function has been reconfigured, to the programmable logic.

10 Claims, 11 Drawing Sheets

(56) References Cited

FOREIGN PATENT DOCUMENTS

| JP | 3834935 B2 | 10/2006 |
| JP | 2007-251329 A | 9/2007 |
| JP | 2008066875 A | 3/2008 |

OTHER PUBLICATIONS

Japanese Office Action dated Aug. 9, 2013 issued during prosecution of related Japanese application No. 2009-097391.

* cited by examiner

DATA PROCESSING APPARATUS AND METHOD FOR CONTROLLING THE APPARATUS

TECHNICAL FIELD

The present invention relates to a data processing apparatus comprising a data processing circuit including a programmable logic and a method of controlling the data processing apparatus.

BACKGROUND ART

In recent years, a programmable logic, such as FPGA (Field Programmable Gate Array), constitutes a data processing circuit for specific application in many products. Previously, the FPGA has been often used as a tool for debugging in research and development. The use of the circuit that can be constituted by the FPGA has been expanded along with an improvement in the LSI manufacturing technology, and the manufacturing cost is reduced. Therefore, there is a trend of mounting the FPGA on various products. The cost can be particularly reduced in small-lot products compared to when ASIC (Application Specific Integrated Circuit) constitutes a data processing circuit for a specific application.

However, in general, the circuit operation and the processing speed of the FPGA may be inferior to those of the ASIC. On the other hand, the FPGA can reconfigure the wiring to connect the logic to reconfigure functions of the FPGA. Therefore, the wiring can be reconfigured in accordance with the functions of the data processing circuit adopting the FPGA. For example, if the image processing circuit of a multi function device (multi function peripheral) is constituted by the FPGA, the functions of the FPGA can be reconfigured in accordance with a scan job, a copy job, and a print job that are available by the multi function device. As a result, an optimal image processing circuit can be constituted in accordance with a job designated by the user, and the performance of the image processing circuit can be improved. Furthermore, there is no need to include processing circuits of hardware corresponding to each job, and the overall circuit size can be reduced. Japanese Patent No. 3834935 (D1) proposes reconfiguration of a configuration of a circuit using the FPGA to process drawing elements, such as characters, figures, and images, using a predetermined drawing command.

To reconfigure the functions of the FPGA, an additional controller is necessary to reconfigure wiring information of the FPGA. Therefore, for example, the following process needs to be executed in the multi function device using the FPGA. For example, when the user inputs a print job into the multi function device from a PC via a network, a main CPU of the multi function device that has received the print job determines whether or not reconfiguration of the functions of the image processing circuit is necessary. If the main CPU determines that the reconfiguration of the functions is necessary, the main CPU temporarily stores the print job received from the PC in a storage device such as an HDD and reconfigures the functions of the FPGA constituting the image processing circuit to process the print job. When the reconfiguration of the functions is completed, the main CPU supplies the print data stored in the storage device to the image processing circuit, and the image processing circuit executes image processing. Therefore, there is a problem that the print data cannot be supplied to the image processing circuit constituted by the FPGA during the reconfiguration of the functions of the FPGA.

Japanese Patent Laid-Open No. 2004-48228 (D2) discloses a technique, in which when an external circuit inputs an initialization signal before writing of a programmable logic unit is completed, active/inactive of the initialization signal is determined to respond to the external circuit. In the invention of D2, there is no need for the external circuit to determine whether the wiring of the programmable logic unit is being reconfigured.

DISCLOSURE OF INVENTION

An aspect of the present invention is to eliminate the above-mentioned problems with the conventional technology.

The feature of the present invention is to provide a data processing apparatus and method thereof in which a reconfiguration process of functions of a programmable logic of the data processing apparatus is executed by the programmable logic to reduce the load of a control unit of a CPU, etc. to improve the performance of data processing of the apparatus.

According to an aspect of the present invention, there is provided a data processing apparatus comprising: data processing means including a programmable logic and a memory storing a plurality of types of circuit information for reconfiguring a function of the programmable logic, for processing data; and control means for controlling to transmit reconfiguration data for reconfiguring the function of the programmable logic to the data processing means, wherein the data processing means reconfigures the function of the programmable logic based on one of the plurality of pieces of circuit information in response to the reception of the reconfiguration data, and the data processing means holds, in a buffer, data that needs to be processed by the programmable logic transmitted from the control means during the reconfiguration of the function of the programmable logic and causes the programmable logic to execute a process based on the data held in the buffer after the reconfiguration of the function of the programmable logic is completed.

Further features and aspects of the present invention will become apparent from the following description of exemplary embodiments, with reference to the attached drawings.

BRIEF DESCRIPTION OF DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Embodiments of the present invention will now be described hereinafter in detail, with reference to the accompanying drawings. It is to be understood that the following embodiments are not intended to limit the claims of the present invention, and that not all of the combinations of the aspects that are described according to the following embodiments are necessarily required with respect to the means to solve the problems according to the present invention.

Figure 1:
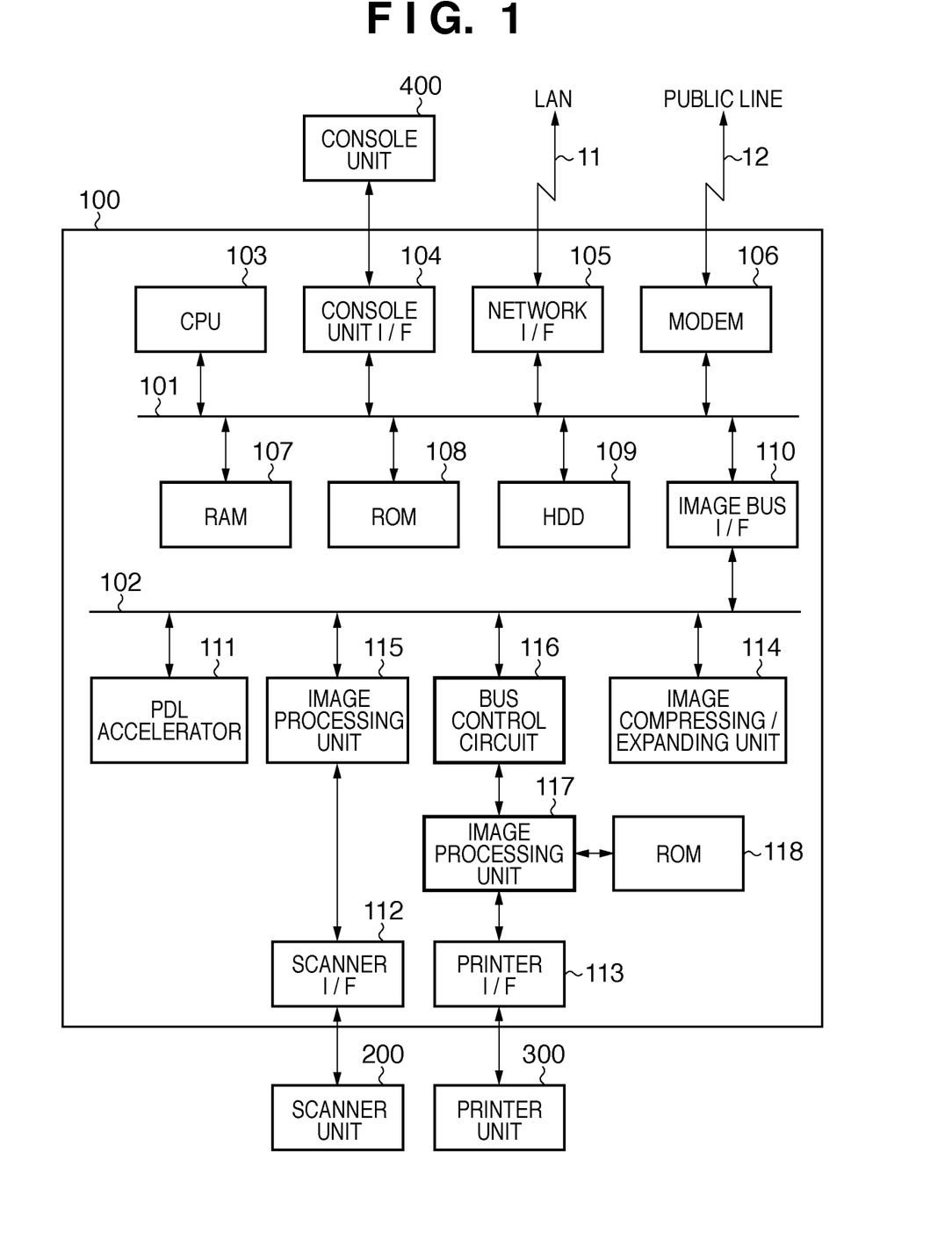
FIG. 1 is a block diagram illustrating a configuration, in which a data processing apparatus according to an embodiment is applied to a multi function device (MFP).

FIG. 1 is a block diagram showing a configuration, in which a data processing apparatus according to an embodiment of the present invention is applied to a multi function device (MFP). The MFP (Multi-Function Peripheral) denotes a multi function peripheral (also called MFP) including a scan function of document, a copy function, a print function, a BOX function, a facsimile function, etc.

A control unit 100 controls the entire operation of the multi function device. The control unit 100 is connected to a console unit 400, a scanner unit 200, and a printer unit 300, and is also connected to a network, such as a LAN 11 and a public line 12, to input and output image information and device information.

A CPU 103 manages the control of the control unit 100 that controls the multi function device. When the CPU 103 receives a job from the console unit 400, or through the LAN 11 or the public line 12, the CPU 103 stores data of the job in a RAM 107 or an HDD 109. The CPU 103 reads out image data of the job from the RAM 107 or the HDD 109 in accordance with the state of the sender of the job and supplies the image data to an image processing unit 115 or 117. The CPU 103 also appropriately transmits register setting data for reconfiguring functions of a programmable logic inside the image processing unit 117 described below. The register setting data and the job data reach the image processing unit in the order of transfer, and subsequent data does not surpass preceding data.

The RAM 107 is a system work memory for the CPU 103 to operate and is also used as an image memory to temporarily store image data. The ROM 108 is used as a boot ROM and stores a boot program of the multi function device. The HDD 109 is a hard disk drive and stores system software, image data, and personal data such as an address book. An image compressing/expanding unit (CODEC) 114 encodes the data, and the data is stored. The data is expanded and restored for use. A device without an HDD stores the data in another storage medium (such as flash memory). A console unit I/F 104 is an interface unit with the console unit 400. The console unit I/F 104 is configured to output image data to be displayed on the console unit 400 to the console unit 400 and transmit information inputted by the user using the console unit 400 to the CPU 103. A network I/F 105 is connected to the LAN 11 and inputs and outputs information. A modem 106 is connected to a public line 12 and executes a modulation/demodulation process for data transmission and reception. These units (devices) are connected to a system bus 101.

An image bus I/F 110 is a bus bridge for connecting the system bus 101 and an image bus 102 that transfers image data fast and for converting the data structure between the buses.

The image bus 102 is constituted by a PCI bus or a high-speed bus such as IEEE 1394. The following devices are arranged on the image bus 102. A raster image processor (PDL accelerator) 111 converts a PDL code into bitmap image data. A scanner I/F unit 112 connects the scanner unit 200 and the control unit 100 and performs synchronous/asynchronous conversion of image data. A printer I/F unit 113 connects the printer unit 300 and the control unit 100 and performs synchronous/asynchronous conversion of image data. The codec 114 executes a compression and expansion process, such as JPEG for multi-value image data and JBIG, MMR, and MH for binary image data. The image data is read out from the HDD 109 and compressed or expanded, and then stored in the HDD 109 again. The image processing unit 115 corrects, processes, and edits the image data inputted from the scanner unit 200. The image processing unit 117 applies correction, resolution conversion, etc. to the print data to be outputted to the printer unit 300. A ROM 118 stores circuit wiring information for image processing of the image processing unit 117. In the image processing unit 117, an internal circuit is reconfigured based on the circuit wiring information stored in the ROM 118. A bus control circuit 116 is a circuit that generates a control signal of the image bus 102. During the reconfiguration of the circuit information of the image processing unit 117, the bus control circuit 116 outputs a control signal for terminating the reception of data from the image bus 102.

Figure 2:
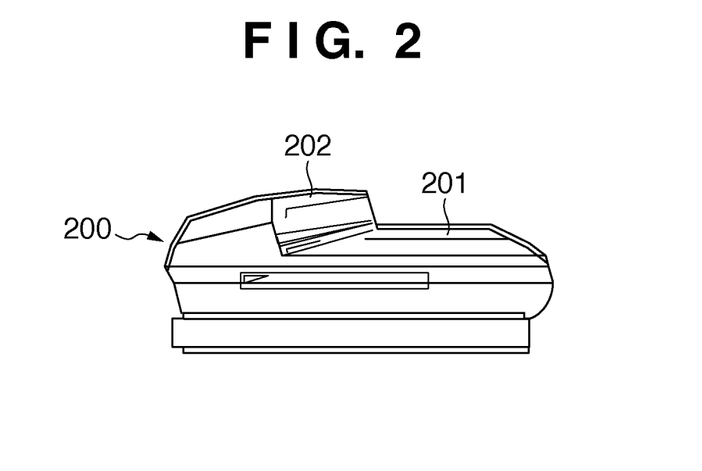
FIG. 2 depicts an overview illustrating a scanner of the multi function device according to the present embodiment.

FIG. 2 depicts an overview illustrating the scanner unit 200 of the multi function device according to the present embodiment.

The scanner unit 200 illuminates an image on paper as a document, and a CCD line sensor (not shown) scans the image to obtain image data that is raster image data. The document is set on a tray 202 of a document feeder 201. The user instructs the activation of reading of the document from the console unit 400, and the CPU 103 provides a reading instruction to the scanner unit 200. As a result, the document feeder 201 feeds the document piece by piece and performs a reading operation of the document.

Figure 3:
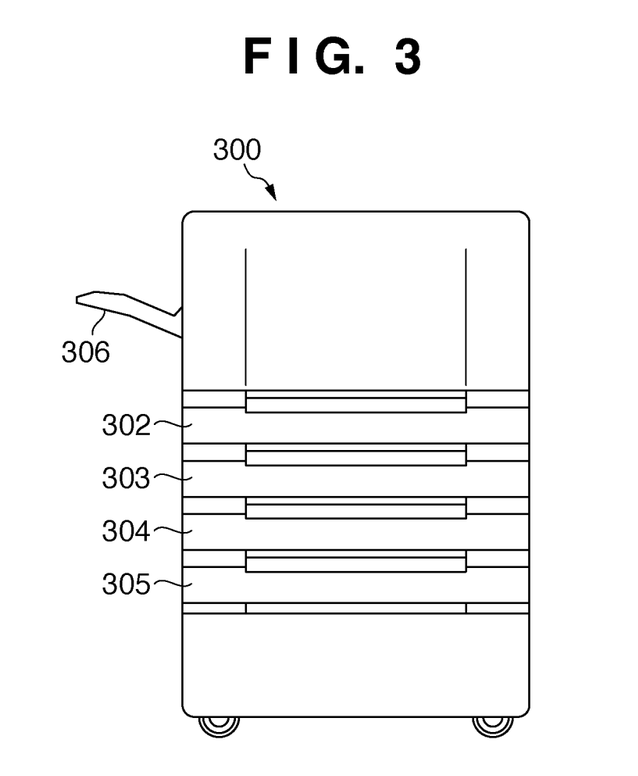
FIG. 3 depicts an overview illustrating a printer of the multi function device according to the present embodiment.

FIG. 3 is an overview illustrating the printer unit 300 of the multi function device of the present embodiments.

The printer unit 300 prints an image on paper based on the raster image data. Examples of the printing method include an electrophotographic method using a photosensitive drum and a photosensitive belt and an ink-jet method for discharging ink from a minute nozzle array to directly print the image on a paper, and any method can be used. The printing operation by the printer unit 300 is started by an instruction from the CPU 103. The printer unit 300 can comprise a plurality of paper feed sources (paper cassettes 302, 303, 304, and 305) to allow selecting different paper sizes or different paper orientations. A paper discharge tray 306 receives paper discharged and printed by the printer unit. Although not shown, the paper may be sorted, or double-sided printing or enlarged/reduced printing may be applied to the paper based on an instruction from the CPU 103, and a staple device or a bookbinding device may bind the paper.

Figure 4:
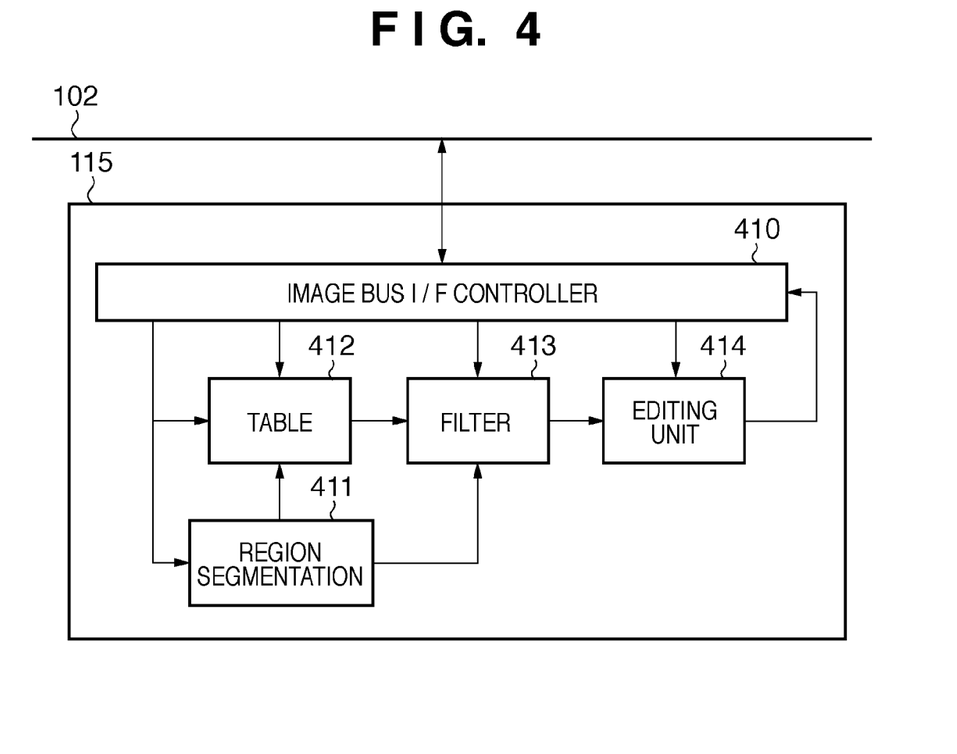
FIG. 4 is a block diagram describing a function configuration of an image processing unit for a scanner unit of the multi function device according to the present embodiment.

FIG. 4 is a block diagram describing a function configuration of the image processing unit 115 for the scanner unit 200 of the multi function device according to the present embodiment.

An image bus I/F controller 410 is connected to the image bus 102, controls a bus access sequence of the image bus 102, controls the devices in the image processing unit 115, and generates timing. A region segmentation unit 411 detects character parts from an input image to determine the region and generates a region signal used in subsequent image processing. A table 412 uses a lookup table to convert image data, which is read out luminance data, into density data. A filter 413 performs convolution calculation by a digital spatial filter in accordance with an object such as edge enhancement. An editing unit 414 recognizes, for example, a closed area surrounded by a marker pen from the input image data and applies image processing to image data in the closed area, such as shadow casting, hatching, and negative-positive inversion. The image data finished with image processing is again transferred to the image bus 102 through the image bus I/F controller 410.

Figure 5:
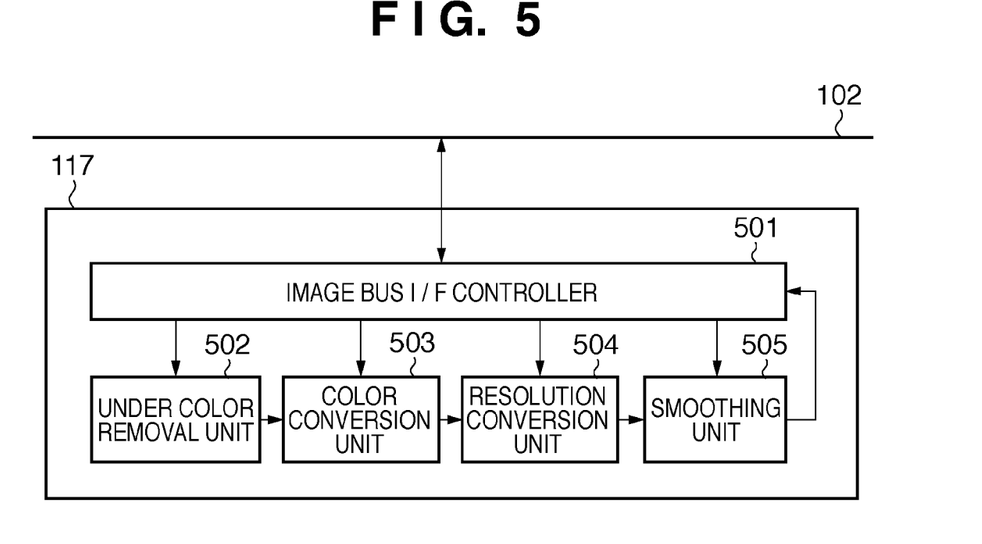
FIG. 5 is a block diagram describing a function configuration of an image processing unit for a printer unit of the multi function device according to the present embodiment.

FIG. 5 is a block diagram describing a function configuration of the image processing unit 117 for the printer unit 300 of the multi function device according to the present embodiment.

An image bus I/F controller 501 is connected to the image bus 102, controls a bus access sequence of the image bus 102, controls the devices in the image processing unit 117, and generates timing. When image data obtained by reading out a document including a light colored background is transmitted, an under color removal unit 502 removes the background color. A color conversion unit 503 converts color in accordance with the output characteristics of the printer unit 300. A resolution conversion unit 504 performs resolution conversion to convert the image data received through the LAN 11 or the public line 12 into the resolution of the printer unit 300. A smoothing unit 505 executes a process of smoothing the jaggy (roughness of image that appears at black/white borders of diagonal lines, etc.) of the image data after the resolution conversion.

Figure 6:
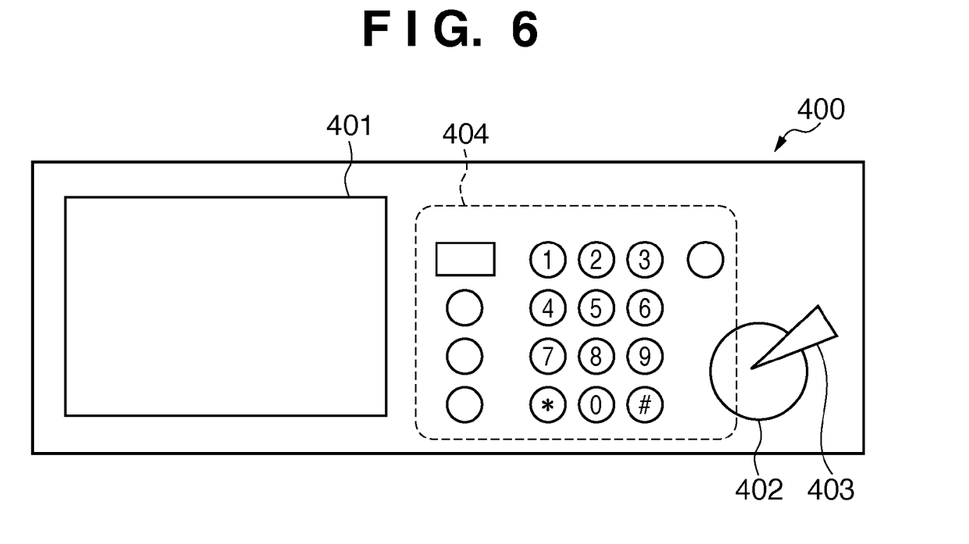
FIG. 6 depicts an outline view illustrating a console unit of the multi function device according to the present embodiment.

FIG. 6 depicts an outline view illustrating the console unit 400 of the multi function device according to the present embodiment.

A liquid crystal operation panel 401 is formed by a combination of liquid crystal and a touch panel and displays settings, soft keys, etc. A start key 402 is a hard key for instructing the start of a copy operation, etc. and green and red LEDs are incorporated. The green LED lights up when the start is possible, and the red LED lights up when the start is impossible. A stop key 403 is a hard key used to terminate an operation in execution. A group of hard keys 404 includes a numeric key, a clear key, a reset key, a guide key, and a user mode key.

Figure 7:
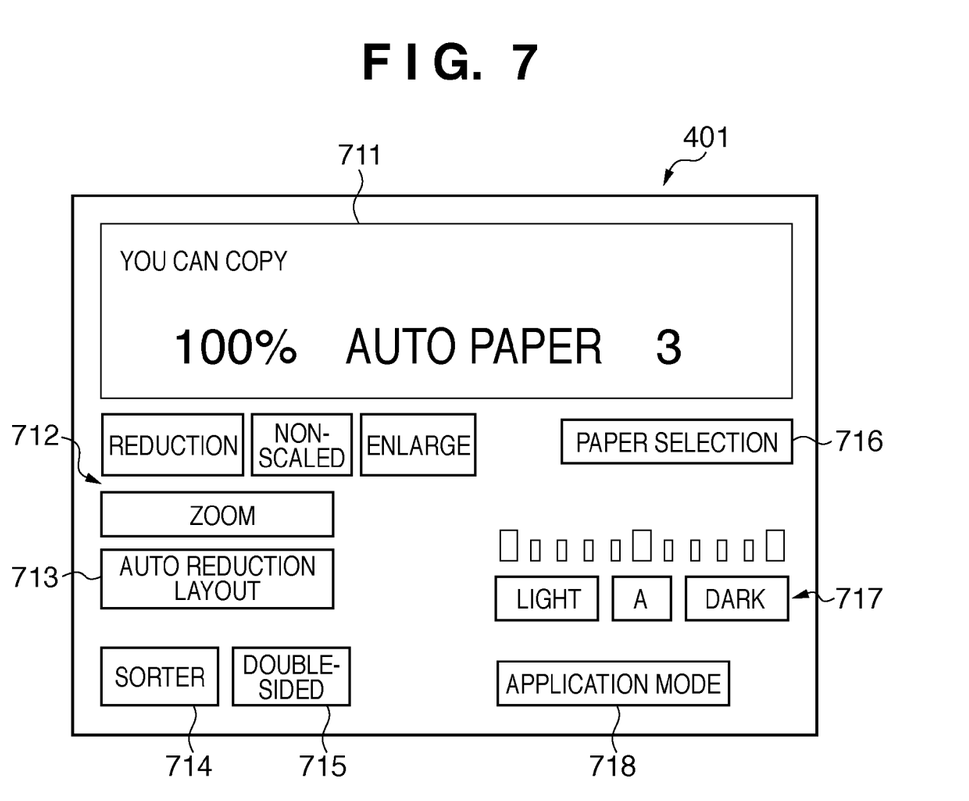
FIG. 7 is an outline view illustrating a state in which a copy screen is displayed on a liquid crystal operation panel of the console unit of the multi function device according to the present embodiment.

FIG. 7 depicts an outline view illustrating a state in which a copy screen is displayed on the liquid crystal operation panel 401 of the consol unit 400 of the multi function device according to the present embodiments.

A settings display section 711 is a part that displays the current operation status of the multi function device, set scaling ratio, type of paper, and the number of copies. A group of scaling ratio soft keys 712 includes non-scaled, enlarge, reduction, and zoom keys that are soft keys related to the scaling ratio upon copying. An auto reduction layout key 713 is a key used to designate the functions according to the present embodiment. A sorter key 714 is used to designate a processing method of the printed paper. A double-sided key 715 is used when the document or the printing method is double-sided printing. A paper selection key 716 is used to make a transition to a screen for designating the size, color, material, etc. of the paper. A group of density setting keys 717 is a part that adjusts the density of reading or printing image and that displays settings. An application mode key 718 is used to make a transition to an application mode screen.

Figure 8:
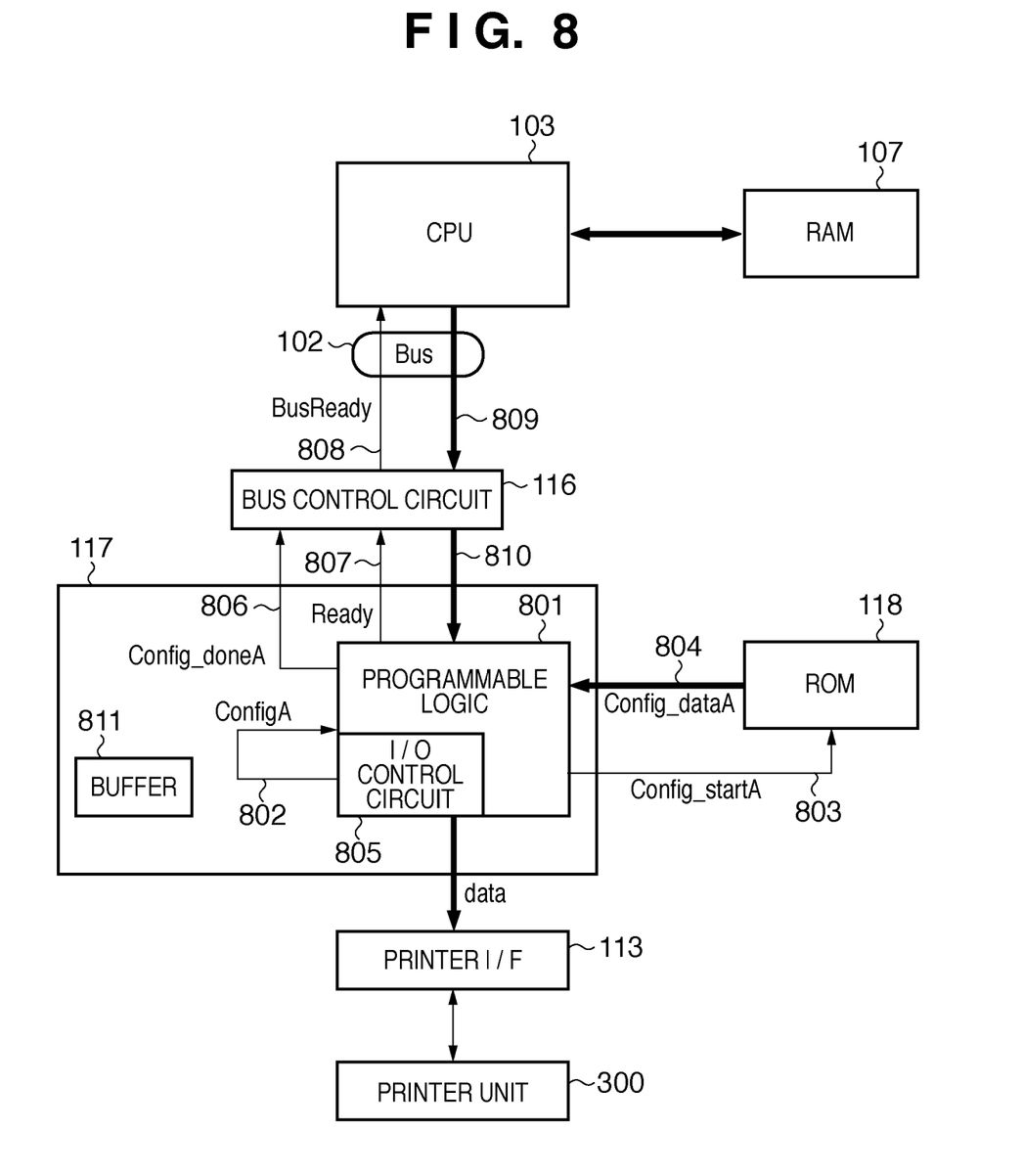
FIG. 8 is a block diagram describing a configuration of the image processing unit of a control unit of the multi function device according to the present embodiment.

FIG. 8 is a block diagram describing a configuration of the image processing unit 117 equivalent to a data processing circuit of the control unit 100 of the multi function device according to the present embodiment. The parts common to FIG. 1 are indicated by the same reference numerals, and the description will not be repeated. In the embodiment, although the image processing unit 117 is the data processing circuit using the FPGA, the image processing unit 115 may also be the data processing circuit using the FPGA.

A programmable logic 801 is a main part of the image processing unit 117 and is an LSI chip for a logic circuit reconfigurable to an optimal circuit in accordance with the data to be processed. A typical example of the programmable logic includes FPGA. When ConfigA 802 is active, the programmable logic 801 asserts (activates) Config_startA 803 and outputs the Config_startA 803 to the ROM 118. As a result, circuit information is loaded from the ROM 118 through Config_dataA 804 to reconfigure the internal wiring in accordance with the circuit information to change the circuit configurations and the functions. Although the FPGA is an LSI chip, the programmable logic 801 may be constituted as a part of an LSI chip of ASIC, etc.

An I/O control circuit 805 is a register constituted inside the programmable logic 801. When the I/O control circuit 805 receives register setting data for reconfiguring the programmable logic 801 transmitted from the CPU 103, the I/O control circuit 805 asserts the ConfigA 802. Although the I/O control circuit 805 is included inside the programmable logic 801 in FIG. 8, the I/O control circuit 805 may be arranged outside the programmable logic 801. A buffer 811 is used to temporarily store job data received from the CPU 103.

The ROM 118 stores circuit information of the programmable logic 801, and when the Config_startA 803 is active, the circuit information is read out through the Config_dataA 804. To allow reconfiguration of the circuit configuration by a plurality of types of circuit information, a plurality of ROMs may be connected to the programmable logic 801 in the same way as the ROM 118, and one of the ROMs may be selected in accordance with the content of processing. Alternatively, the ROM 118 may store a plurality of pieces of circuit information, and a desired piece of information may be selected and read out based on an address or a selector signal. The circuit information may be stored in the ROM 108 of the control unit 100, and the circuit information may be read out under the control of the CPU 103 and supplied to the programmable logic 801.

The bus control circuit 116 inactivates BusReady 808 when Config_doneA 806 or Ready 807 is inactive to prohibit input of data from the bus 102. Although the bus control circuit 116 is arranged outside the programmable logic 801 in FIG. 8, the bus control circuit 116 may be arranged inside the programmable logic 801.

The printer I/F unit 113 is an interface for outputting an output from the programmable logic 801 to the printer unit 300.

The ConfigA 802 is a control signal for starting the reconfiguration of wiring of the programmable logic 801. The Config_startA 803 is a control signal for starting loading of the circuit information from the ROM 118. The Config_dataA 804 is a bus signal for transferring the circuit information read out from the ROM 118 to the programmable logic 801. The Config_doneA 806 is a control signal that is inactive when the programmable logic 801 is updating the circuit information and that is active when the update is completed.

The image bus 102 is a bus for transmitting the register setting data and the image data. Although the CPU 103 is connected to the image bus 102 through the system bus 101 and the image bus I/F 110, the connection is not illustrated.

The Ready 807 is a control signal indicating whether the programmable logic 801 can process data. The BusReady 808 is a control signal for notifying the CPU 103 whether the programmable logic 801 can receive data. BusData 809 and 810 denote data outputted from the CPU 103 to the programmable logic 801.

In a first embodiment of the present invention, a processing method will be described, in which the image processing unit 117 of the multi function device (MFP) is constituted by the FPGA, and the multi function device receives a print job during processing of a copy job.

While the MFP executes the copy job, the image data scanned by the scanner unit 200 is inputted to the control unit 100 through the scanner I/F unit 112. The image processing unit 115 applies image processing, such as correction, processing, and edit, to the scanned image data. The image data is further compressed by the codec 114 if necessary and stored in the RAM 107 or the HDD 109 through the image bus 102, the image bus I/F 110, and the system bus 101.

The CPU 103 communicates with the printer unit 300, and when printing by the printer unit 300 is ready, the CPU 103 transmits the image data stored in the HDD 109 to the image processing unit 117 through the system bus 101, the image bus I/F 110, and the image bus 102. At this point, the codec 114 also expands the image data if necessary. The image processing unit 117 applies image processing, such as correction and resolution conversion, to the image data in accordance with the specifications of the printer unit 300. In this case, the image processing units 115 and 117 are image processing circuits suitable for processing of image data inputted and outputted in the copy job. After the execution of the image processing for the printer unit 300, the processed image data is transmitted to the printer unit 300 through the printer I/F unit 113, and printing is executed.

A process of the MFP when a print job is received during or after the execution of processing of the copy job will now be described.

Figure 9:
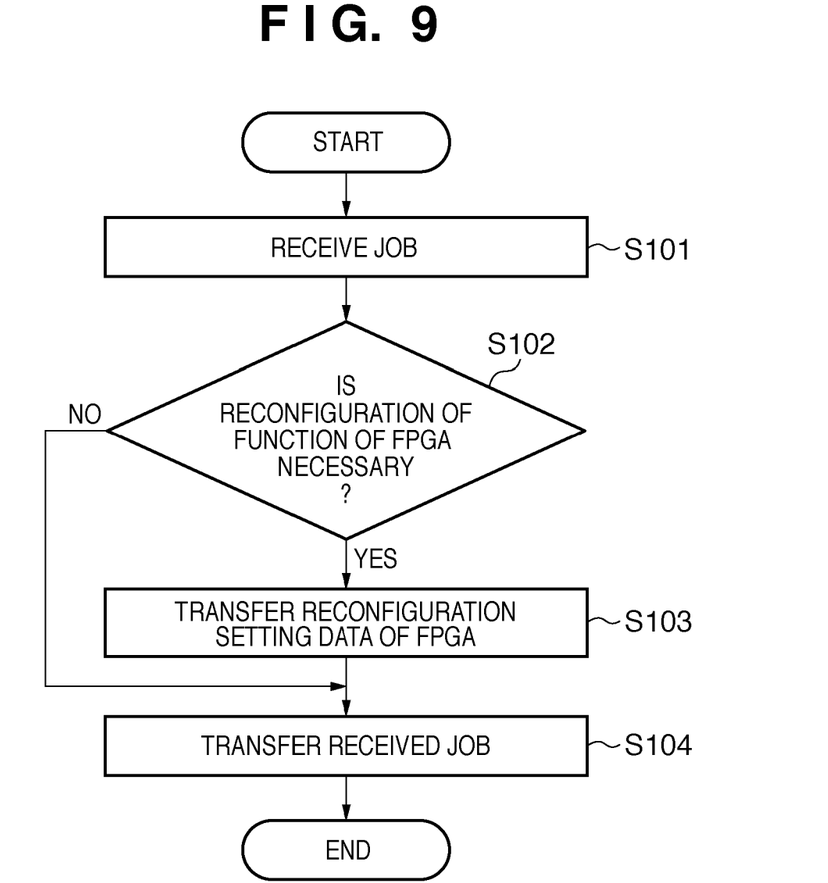
FIG. 9 is a flow chart describing a control process by the control unit when the MFP according to a first embodiment receives a job.

FIG. 9 is a flow chart describing a control process by the control unit 100 when the MFP according to the first embodiment receives a job. A program for executing the process is stored in the ROM 108 or loaded from the HDD 109 to the RAM 107 upon execution, and the program is executed under the control of the CPU 103.

In step S101, although not shown, a print job is received from an information processing terminal (PC) on the LAN 11. This leads the CPU 103 to store the received job data in the HDD 109 through the LAN 11, the network I/F 105, and the system bus 101. The process proceeds to step S102, and the CPU 103 determines whether or not reconfiguration of functions of the FPGA of the image processing unit 117 is necessary based on the received job. If the CPU 103 determines that the reconfiguration is necessary, the process proceeds to step S103. If the CPU 103 determines that the reconfiguration is not necessary, the process proceeds to step S104.

The CPU 103 stores a job management list in the HDD 109, and in step S102, the CPU 103 identifies the type of the received job based on a header of the received job. The CPU 103 compares the received job with the job processed lastly in the stored job management list, and if the jobs are different from each other, the CPU 103 determines that the reconfiguration of functions is necessary. The CPU 103 determines that the reconfiguration of functions is unnecessary if the jobs are the same. If information of monochrome or color may be added to the job management list, then the CPU 103 determines whether or not the reconfiguration of functions is necessary based on whether the jobs are monochrome or colored, even if the jobs are the same. The contents described in the job management list and the comparing conditional expressions of comparison are predetermined.

In the first embodiment, a case will be described, in which while a copy job is currently in execution and job information of the copy job is held in the job management list, the CPU 103 determines that the reconfiguration of functions of the FPGA is necessary if a print job is received.

In step S103, the CPU 103 transfers the register setting data, in which the setting of a register for function reconfiguration of the FPGA is set to "reconfiguration", to the image processing unit 117. The register is provided in the FPGA. The CPU 103 further transfers the register setting data for setting parameters of the image processing unit 117 after the reconfiguration of wiring, to the image processing unit 117. The parameter setting data indicates values of an LUT (lookup table), image size, etc. in the image processing unit 117.

The process proceeds to step S104, and the CPU 103 reads out the job data stored in step S101 from the HDD 109 and transfers the job data to the image processing unit 117. Since a process for reconfiguring the functions of the FPGA is not started, the job data is received by the image processing unit 117 and temporarily stored in the buffer 811 of the image processing unit 117. After the completion of the reconfiguration of the functions of the FPGA, the job data stored in the buffer 811 is processed in accordance with the reconfigured functions of the FPGA. As a result, the CPU 103 is quickly released from processing of the job data received in step S101.

Figure 10:
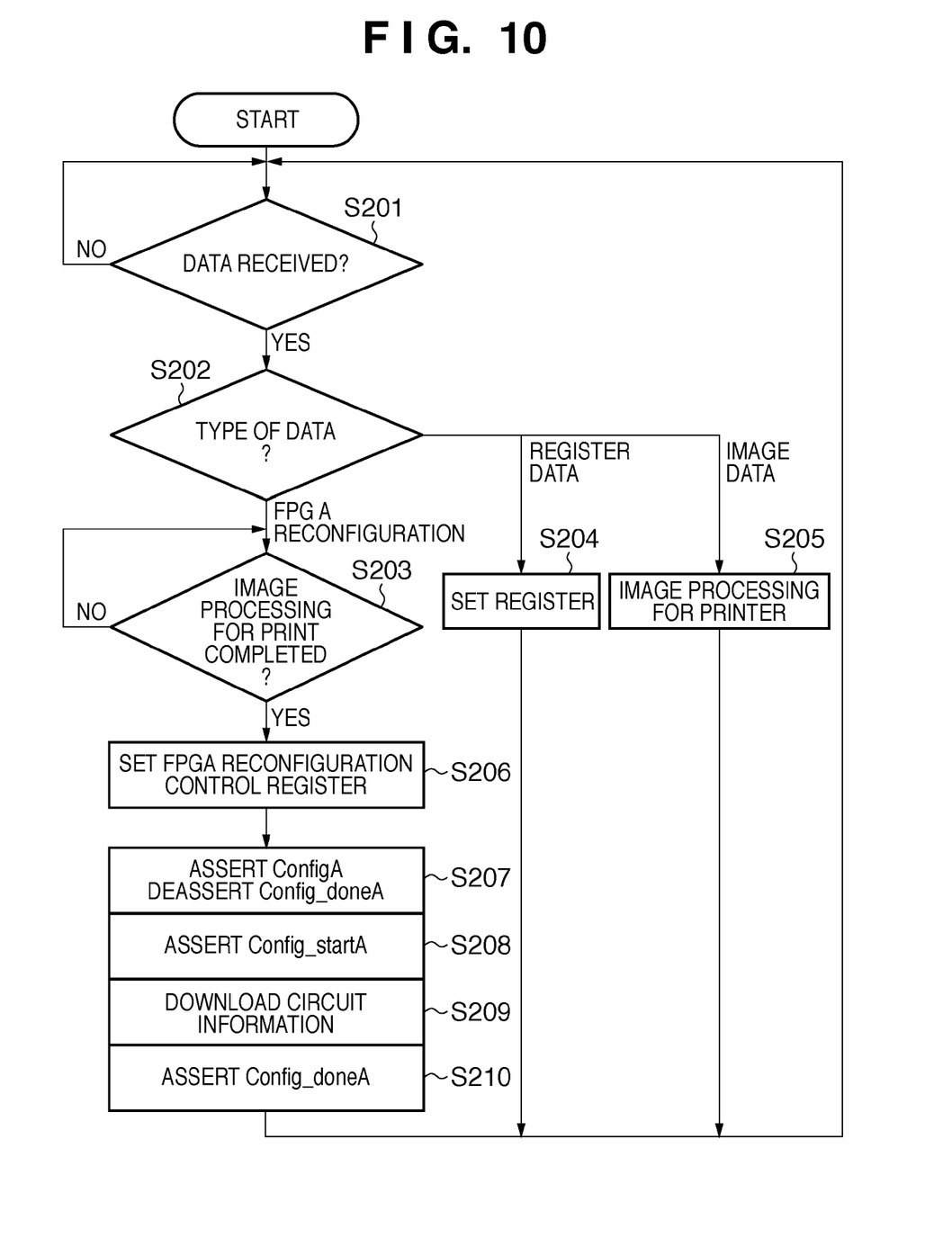
FIG. 10 is a flow chart describing a process of the image processing unit according to the first embodiment.

FIG. 10 is a flow chart describing a process of the image processing unit 117 according to the first embodiment.

In step S201, the image processing unit 117 waits for the reception of data via the bus control circuit 116. The process proceeds to step S202 when the data is received, and the image processing unit 117 determines the type of the received data.

Figure 11:
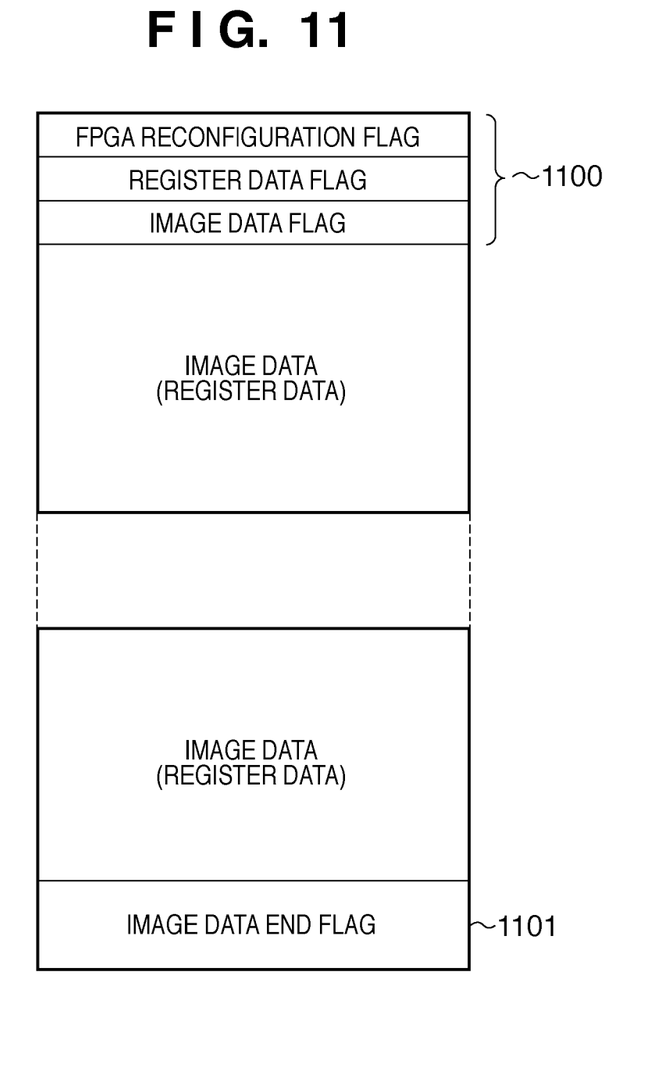
FIG. 11 is a diagram describing a configuration of data received in step S202 of FIG. 10.

FIG. 11 is a diagram describing a configuration of data received in step S202.

In FIG. 11, reference numeral 1100 denotes a header, and the type of the data is described in the header 1100. The image processing unit 117 determines the content of the header 1100 in step S202.

In step S202, if the image processing unit 117 determines that an FPGA function reconfiguration flag of the header 1100 is ON (1), the process proceeds to step S203. If a register data flag of the header 1100 is ON, the process proceeds to step S204. If an image data flag of the header 1100 is ON, the process proceeds to step S205. It is an example to determine the type of the data using the header, and the present invention is not limited to the determination method.

In step S204 (upon receiving register data), the image processing unit 117 sets the register data into a register in the image processing unit 117. The image processing unit 117 receives the register data following the header 1100 and sets the register data to an internal processing block of the image processing unit 117 to set the register. The process then proceeds to step S201, and the image processing unit 117 receives the next data.

In step S205 (upon receiving image data), the image processing unit 117 acquires image data after the header 1100 and performs image processing on the image data for printer. The process then proceeds to step S201, and the image processing unit 117 receives the next data.

When the FPGA function reconfiguration flag of the header 1100 is ON, the image processing unit 117 determines in step S203 whether or not the image data processing by the FPGA is completed before executing the function reconfiguration process of the FPGA. In the step S203, it is determined based on an interrupt control signal that is asserted when an internal image processing block at the last phase of the FPGA has processed image data, that is, all image data has been processed. For example, when an image data end flag 1101 of a footer at the end of the received data shown in FIG. 11 is received, the image processing unit 117 determines that the process has been completed and asserts the interrupt control signal.

When the image processing unit 117 determines that the data processing by the FPGA is completed, the process proceeds to step S206, and the image processing unit 117 acquires data following the header 1100 to set a reconfiguration control register of the FPGA. The reconfiguration control register of the FPGA controls an input/output control port of the I/O control circuit 805. The image processing unit 117 writes "1" in the reconfiguration control register to assert the ConfigA 802 to start the reconfiguration of the FPGA.

Before setting the register, the image processing unit 117 may select the circuit information of the ROM 118 in accordance with the job. For example, although not shown, a plurality of ROMs may be prepared in addition to the ROM 118, and the circuit information suitable for each job process may be stored in each ROM. A bus select circuit may be arranged between the image processing unit 117 and the ROM 118, and a bus select register for setting the I/O control circuit 805 may be further prepared on the image processing unit 117 to control switching of the bus select circuit. The CPU 103 transmits bus select register setting data in accordance with the job before the reconfiguration control register setting of the FPGA to allow selecting the circuit information in accordance with the type of job processing among a plurality of pieces of circuit information.

The process proceeds to step S207, and as a result of setting the FPGA reconfiguration control register to "1" in step S206, the image processing unit 117 asserts the ConfigA 802 and starts a reconfiguration process of the functions of the FPGA. At the same time, the image processing unit 117 deasserts the Config_doneA 806 to notify external devices (in FIG. 8, the bus control circuit 116) that the functions of the FPGA are being reconfigured. The process then proceeds to step S208, and the image processing unit 117 asserts the Config_startA 803 for the ROM 118. The process proceeds to step S209, and the Config_startA 803 triggers the downloading of the circuit information. That is, the image processing unit 117 downloads the circuit information from the ROM 118 thorough the Config_dataA 804 and reconfigures the internal circuit of the FPGA in accordance with the circuit information. The process proceeds to step S210, and the image processing unit 117 asserts the Config_doneA 806 when the reconfiguration of the FPGA has been completed in step S209. The process then proceeds to step S201 and waits for the reception of the next data.

Figure 12:
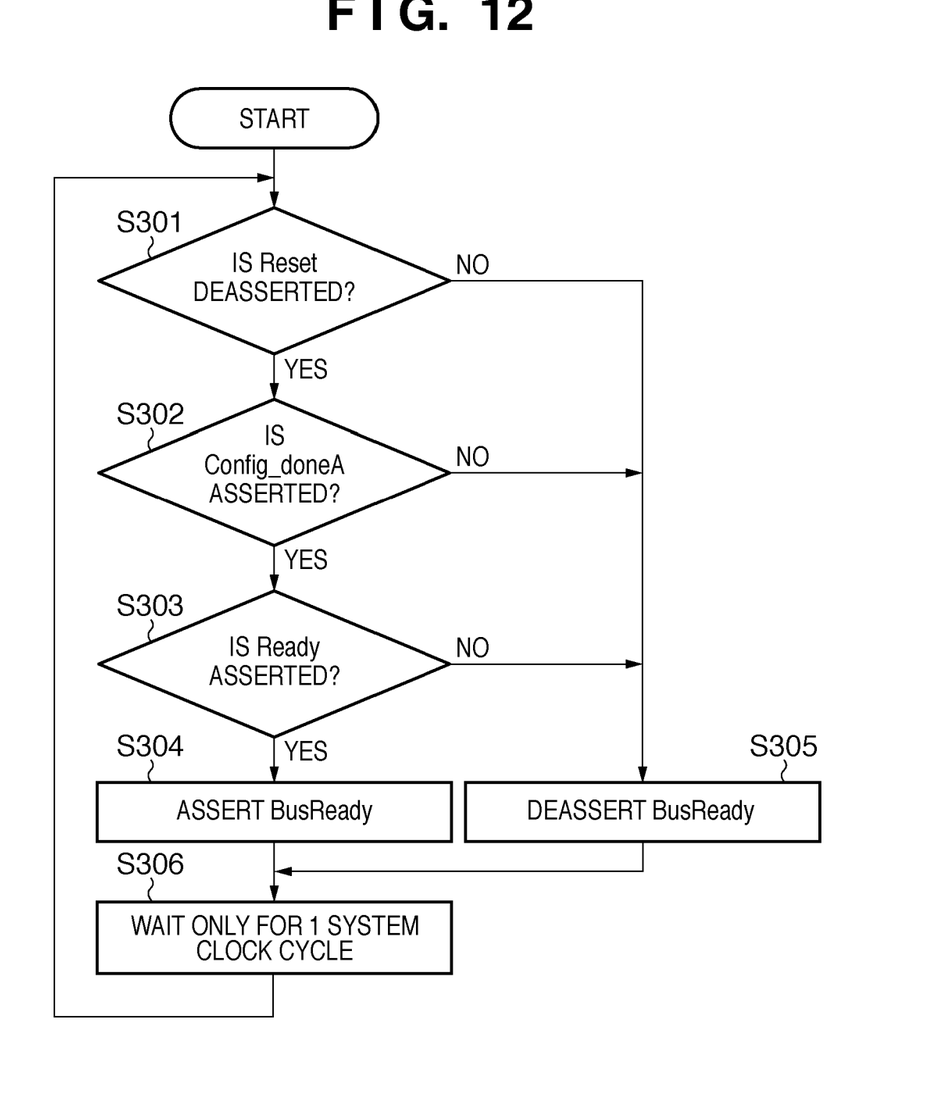
FIG. 12 is a flow chart describing a process of a bus control circuit according to the present embodiment.

FIG. 12 is a flow chart describing a process of the bus control circuit 116 according to the present embodiment.

First, in step S301, the bus control circuit 116 detects whether a Reset signal (not shown) is deasserted (not enabled). If the Reset signal is deasserted, the process proceeds to step S302, and if not (asserted), the process proceeds to step S305. In step S302, the bus control circuit 116 determines whether or not the Config_doneA 806 is asserted. If the Config_doneA 806 is asserted, the process proceeds to step S303, and if the Config_doneA 806 is deasserted, the process proceeds to step S305. In step S303, the bus control circuit 116 determines whether or not the Ready 807 from the image processing unit 117 is asserted. If the Ready 807 is asserted, the process proceeds to step S304, and if the Ready 807 is deasserted, the process proceeds to step S305. In step S304, the bus control circuit 116 asserts the BusReady 808 and notifies the CPU 103 that the data from the image processing unit 117 connected to the image bus 102 can be received. Meanwhile, in step S305, the bus control circuit 116 deasserts the BusReady 808 and notifies the CPU 103 that the data cannot be received through the image bus 102. After the execution of step S304 or S305, the process proceeds to step S306. The bus control circuit 116 waits for just one period of a system clock and proceeds to step S301.

In this way, the bus control circuit 116 synchronizes with the system clock to control the BusReady 808. As a result, in the period from step S207 to step S210 in which the image processing unit 117 reconfigures the FPGA, the BusReady 808 and the Config_doneA 806 are deasserted. Therefore, the CPU 103 cannot receive the data through the image bus 102 during the reconfiguration of the FPGA so that it is possible to terminate inputting of image data via the image bus 102 during the reconfiguration of the FPGA.

As described, according to the first embodiment, when the MFP receives a print job during execution of a copy job, the CPU can insert the reconfiguration setting data of FPGA between the print job and the copy job and transmit the print job to the image processing unit 117 before the reconfiguration of the FPGA is completed. Although the first embodiment is applied to the MFP, it is obvious that the first embodiment can also be applied to an information processing apparatus using a programmable logic.

As described at the beginning, specifications of size and operation speed of a circuit including the FPGA are not disclosed as those of the ASIC in some cases. In that case, the circuit is divided into two or more blocks. In a second embodiment, an internal module of the image processing unit 117 is divided into two, and two FPGAs are cascaded.

Figure 13:
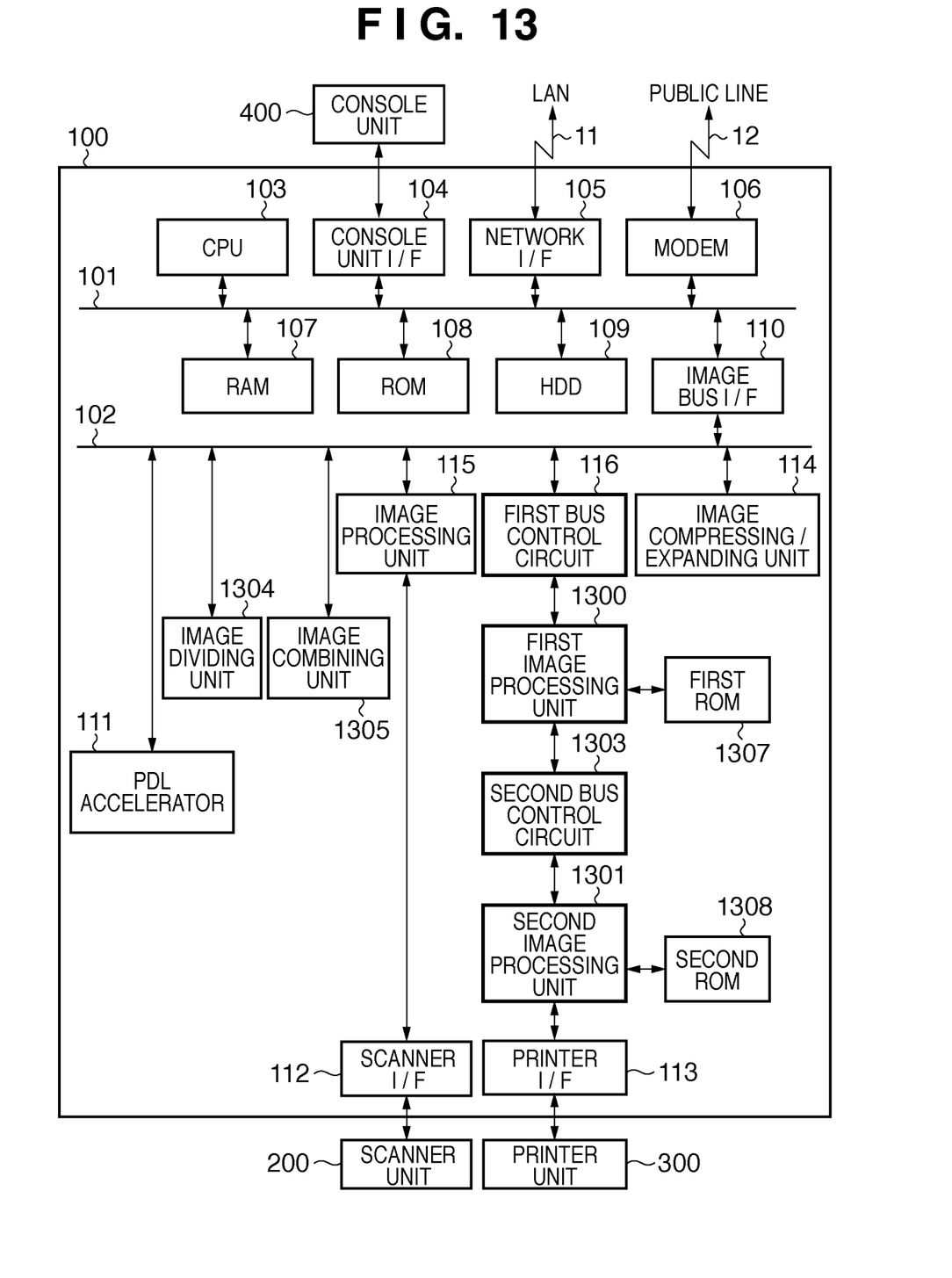
FIG. 13 is a block diagram showing a configuration, in which the data processing apparatus according to a second embodiment of the present invention is applied to the multi function device (MFP).

FIG. 13 is a block diagram showing a configuration, in which the data processing apparatus according to the second embodiment of the present invention is applied to the multi function device (MFP). The parts common to FIG. 1 are illustrated by the same reference numerals, and the description will not be repeated.

In FIG. 13, the image processing unit 117 of the control unit 100 of the MFP is divided into a first image processing unit 1300 and a second image processing unit 1301. In the second embodiment, the first image processing unit 1300 and the second image processing unit 1301 are connected in series via a second bus control circuit 1303 on the assumption that image processing in the image processing unit 117 of the first embodiment is executed in the order of inputted image data. However, if there is no dependency in the order of processing, the first image processing unit 1300 and the second image processing unit 1301 may be arranged in parallel.

An image dividing unit 1304 divides the image data into a plurality of blocks. An image combining unit 1305 executes a process of integrating the divided image data to form image data.

ROMs 1307 and 1308 respectively supply circuit information of the FPGAs of the first image processing unit 1300 and the second image processing unit 1301. The bus control circuit 1303 connects the first image processing unit 1300 and the second image processing unit 1301. With the configuration, a processing method when the MFP receives a FAX job during processing of a print job will now be described.

Figure 14:
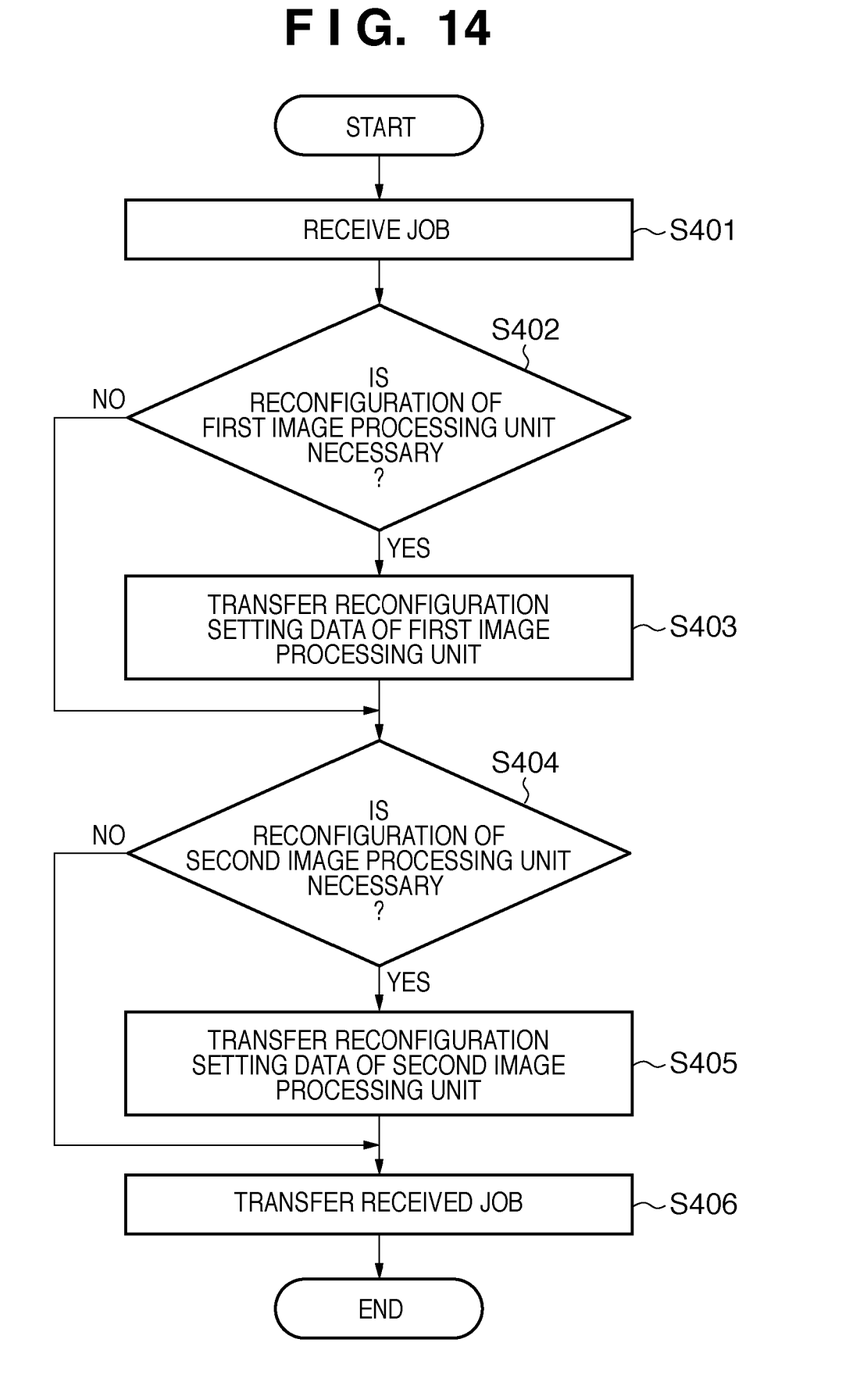
FIG. 14 is a flow chart describing a control process by the control unit when the MFP according to the second embodiment receives a FAX job.

FIG. 14 is a flow chart describing the control process by the control unit 100 when the MFP according to the second embodiment receives a FAX job. A program for executing the process is stored in the ROM 108 or loaded from the HDD 109 to the RAM 107 upon execution, and the program is executed under the control of the CPU 103.

In step S401, the CPU 103 receives image data inputted through the modem 106 from the public line 12. The codec 114 expands the inputted image data by MMR or MH used in data transmission and reception of FAX. The CPU 103 then stores the expanded image data in the RAM 107 or the HDD 109 through the image bus 102, the image bus I/F 110, and the system bus 101.

The process proceeds to step S402, and the CPU 103 determines whether or not reconfiguration of the FPGA of the first image processing unit 1300 is necessary based on the job received in step S1. If the CPU 103 determines that the reconfiguration is necessary, the process proceeds to step S403, and if the CPU 103 determines that the reconfiguration is not necessary, the process proceeds to step S404. In the second embodiment, since the MFP receives the FAX job during processing of the print job, the first image processing unit 1300 is a circuit suitable for image processing of the print job in execution. Therefore, the CPU 103 determines that the first image processing unit 1300 needs to be reconfigured to be suitable for image processing of the FAX job, and the process proceeds to step S403. In step S403, the CPU 103 transmits the register setting data to set the setting of the FPGA reconfiguration register in the FPGA of the first image processing unit 1300 to "reconfiguration", and the process proceeds to step S404. The FPGA of the first image processing unit 1300 starts reconfiguration after the image data processing for the print job by the FPGA has been completed, as in step 203 (FIG. 10).

In step S404, as in step S402 described above, the CPU 103 determines whether reconfiguration of the FPGA of the second image processing unit 1301 is necessary based on the job received in step S1. If the CPU 103 determines that the reconfiguration is necessary, the process proceeds to step S405, and if not, the process proceeds to step S406. In the second embodiment, the second image processing unit 1301 is a circuit suitable for image processing of the print job in execution. Therefore, the CPU 103 determines that the reconfiguration to a circuit suitable for image processing of the FAX job is necessary, and the process advances to step S405.

In step S405, the CPU 103 transmits the register setting data to set the setting of the FPGA reconfiguration register in the FPGA of the second image processing unit 1301 to "reconfiguration", and the process proceeds to step S406. The FPGA of the second image processing unit 1301 also starts reconfiguration after the image data processing for the print job by the FPGA has been completed, as in step 203 (FIG. 10). In step S406, the CPU 103 transfers the image data stored in step S401 from the HDD 109 to the first image processing unit 1300. As a result, the CPU 103 is quickly released from data processing for the FAX job as in step S104 of FIG. 9. Therefore, the performance of the CPU 103 improves.

The operations of the first and second image processing units 1300 and 1301 as well as the first ROM 1307, the second ROM 1308, and the second bus control circuit 1303 for reconfiguring the functions of the FPGA are substantially the same as the operations of the image processing unit 117, the ROM 118, and the bus control circuit 116 of the first embodiment. Therefore, the description will not be repeated.

As described, according to the second embodiment, if the CPU determines that reconfiguration of the FPGA is necessary when the MFP receives a FAX job during processing of a print job, the CPU inserts reconfiguration setting data for reconfiguring the FPGA between the jobs to instruct the reconfiguration. As a result, the FAX job can be adequately processed.

Furthermore, even if a plurality of FPGAs are connected, the CPU inserts setting data of reconfiguration of FPGA between jobs in each FPGA to execute the reconfiguration process of the plurality of FPGAs.

Although the second embodiment is applied to the MFP in the description, it is obvious that the second embodiment can also be applied to an information processing apparatus, such as a PC, using a programmable logic. The programmable logic may also be a reconfigurable processor.

OTHER EMBODIMENTS

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-097391, filed Apr. 13, 2009, which is hereby incorporated by reference herein in its entirety.

The invention claimed is:

1. A data processing apparatus comprising:
a CPU (Central Processing Unit);
a programmable logic included in an image processing unit being different from the CPU; and
a memory storing a plurality of types of circuit information for reconfiguring a function of the programmable logic,
wherein, when the CPU receives a job, the CPU transmits setting information indicating a type of circuit information being necessary for processing the job and job data to the programmable logic,
wherein, when the programmable logic receives the setting information, the programmable logic reconfigures the function of the programmable logic using the type of circuit information indicated by the setting information in a case that processing of the image processing unit has completed, or after the processing of the image processing unit has completed if the image processing unit executes processing, and
wherein, the image processing unit stores the job data received from the CPU into a buffer, in a case that reconfiguration of the function of the programmable logic has not completed, and executes processing in accordance with the job data stored in the buffer after the reconfiguration of the function of the programmable logic has completed.

2. The data processing apparatus according to claim 1, further comprising a first control unit that prohibits input of the job data from the buffer to the programmable logic during the reconfiguration of the function of the programmable logic based on the circuit information.

3. The data processing apparatus according to claim 1, wherein the programmable logic is an Field Programmable Gate Array.

4. The data processing apparatus according to claim 1, wherein the programmable logic is a reconfigurable processor.

5. The apparatus according to claim 1, further comprising a second control unit that prohibits input of the job data from the CPU to the programmable logic during reconfiguration of the function of the programmable logic, or the programmable logic executes processing.

6. A method for controlling a data processing apparatus having a CPU (Central Processing Unit), a programmable logic included in an image processing unit being different from the CPU, and a memory storing a plurality of types of circuit information for reconfiguring a function of the programmable logic, comprising:

when the CPU receives a job, transmitting, for the CPU, setting information indicating a type of circuit information being necessary for processing the job and job data to the programmable logic;

when the programmable logic receives the setting information, reconfiguring, for the programmable logic, the function of the programmable logic using the type of circuit information indicated by the setting information in a case that processing of the image processing unit has completed, or after the processing of the image processing unit has completed if the image processing unit executes processing;

storing, for the image processing unit, the job data received from the CPU into a buffer, in a case that reconfiguration of the function of the programmable logic has not completed; and executing, for the image processing unit, a process in accordance with the job data stored in the buffer after the reconfiguration of the function of the programmable logic has completed.

7. The method according to claim 6, further comprising a first control step of prohibiting input of the job data from the buffer to the programmable logic during the reconfiguration of the function of the programmable logic based on the circuit information.

8. The method according to claim 6, wherein the programmable logic is an Field Programmable Gate Array.

9. The method according to claim 6, wherein the programmable logic is a reconfigurable processor.

10. The method according to claim 6, further comprising a second control step that prohibits input of the job data from the CPU to the programmable logic during reconfiguration of the function of the programmable logic or the programmable logic executes processing.

* * * * *